(12) United States Patent
Jan

(10) Patent No.: US 7,649,387 B2
(45) Date of Patent: Jan. 19, 2010

(54) OUTPUT DRIVING CIRCUITS

(75) Inventor: Shiun-Dian Jan, Taipei County (TW)

(73) Assignee: Princeton Technology Corporation, Taipei County (TW)

( * ) Notice: Subject to any disclaimer, the term of this patent is extended or adjusted under 35 U.S.C. 154(b) by 0 days.

(21) Appl. No.: 12/043,699

(22) Filed: Mar. 6, 2008

(65) Prior Publication Data

US 2009/0160494 A1    Jun. 25, 2009

(30) Foreign Application Priority Data

Dec. 21, 2007   (TW)   .............................. 96149198 A

(51) Int. Cl.
*H03B 1/00* (2006.01)
*H03K 3/00* (2006.01)

(52) U.S. Cl. .................. 327/112; 327/108; 327/33; 326/63; 326/82

(58) Field of Classification Search ......... 327/108–112, 327/333, 379, 389, 391; 326/22–27, 68, 326/80–83, 86, 87
See application file for complete search history.

(56) References Cited

U.S. PATENT DOCUMENTS

2004/0113677 A1* 6/2004 Clark et al. ................. 327/333
2005/0127977 A1* 6/2005 Itoh ........................... 327/333

* cited by examiner

*Primary Examiner*—Lincoln Donovan
*Assistant Examiner*—Brandon S Cole
(74) *Attorney, Agent, or Firm*—Muncy, Geissler, Olds & Lowe, PLLC

(57) ABSTRACT

An output driving circuit is disclosed, providing an output signal at an output node and comprises an inverter and an output driver. A first P-type transistor and a first N-type transistor of the inverter are coupled in series between high and low voltage sources and controlled respectively by first and second driving signals. A gate oxide layer of the first N-type transistor is thinner than that of the first P-type transistor. The inverter generates a first driving signal. A second P-type transistor and a second N-type transistor of the output driver are coupled in series at the output node between the high and low voltage sources. The second P-type transistor and the second N-type transistor are controlled respectively by the first driving signal and a second driving signal. A falling time of the first driving signal is longer than a falling time of the second driving signal.

20 Claims, 2 Drawing Sheets

OUTPUT DRIVING CIRCUITS

BACKGROUND OF THE INVENTION

1. Field of the Invention

The invention relates to an output driving circuit, and more particularly to an output driving circuit preventing generation of a large current when power is on.

2. Description of the Related Art

FIG. 1 shows a conventional output driving circuit. Referring to FIG. 1, an output driving circuit 1 comprises a signal divider 10, a level shifter 11, an inverter 12, and an output driver 13. The signal divider 10 receives an input signal IN and generates driving signals DS10 and DS 11 according to the input signal IN. The level shifter 11 receives the driving signal DS 10 and changes the level of the driving signal DS 10 to generate a voltage signal VS10. The voltage signal VS10 controls a P-type transistor 120 and an N-type transistor 121 within the inverter 12. As shown in FIG. 1, gates of the P-type transistor 120 and the N-type transistor 121 receive the voltage signal VS. The inverter 12 outputs a driving signal DS12 to a P-type transistor 130 in the output driver 13. In the output driver 13, the P-type transistor 130 is controlled by the driving signal DS12, while an N-type transistor 131 is controlled by the driving signal DS 11. The connection node at which the P-type transistor 130 and the N-type transistor 131 are coupled together serves as an output node Nout of the output driving circuit 1 to connect to an output pin. Referring to FIG. 1, the level shifter 11, the inverter 12, and the output driver 13 are coupled to a high voltage source VH.

Since the driving signals DS11 and DS12 are in-phase signals, the P-type transistor 130 and the N-type transistor 131 are turned on simultaneously for a short period of time when the on-off states of the transistors 130 and 131 are switched, so that a large current is generated and passes through the output node Nout. Thus, after the output driving circuit 1 operates for a long period of time, output copper lines and bonding of output pins will become damaged, and the output driving circuit 1 will cease to operate Moreover, since the level shifter 11 and the inverter 12 are coupled to the high voltage source VH, the P-type transistor 120 and the N-type transistor 121 are formed by thick gate oxide layers, thus increasing output driving circuit 1 area.

BRIEF SUMMARY OF THE INVENTION

An exemplary embodiment of an output driving circuit is disclosed, comprising an inverter and an output driver. The output driving circuit receives an input signal and provides an output signal at an output node. The inverter generates a driving signal at a first node and comprises a first P-type transistor and a first N-type transistor. The first P-type transistor has a control terminal receiving a first voltage signal, a first terminal coupled to a first high voltage source, and a second terminal coupled to the first node. The first N-type transistor has a control terminal coupled to a second voltage signal, a first terminal coupled to the first node, and a second terminal coupled to a low voltage source. The output driver is coupled to the inverter and comprises a second P-type transistor and a second N-type transistor. The second P-type transistor has a control terminal receiving the first driving signal, a first terminal coupled to the first high voltage source, and a second terminal coupled to the output node. The second N-type transistor has a control terminal coupled to a second driving signal, a first terminal coupled to the output node, and a second terminal coupled to the low voltage source. A falling time of the first driving signal is longer than a falling time of the second driving signal.

Another exemplary embodiment of an output driving circuit comprises a signal divider, a level shifter, first to third N-type transistors, and first and second P-type transistors. The output driving circuit receives an input signal and provides an output signal at an output node. The signal divider receives the input signal and generates a first driving signal and a second driving signal according to the input terminal. The level shifter is coupled between a first high voltage source and a low voltage source. The level shifter has an input terminal receiving the first driving signal and an output terminal outputting a first voltage signal. The first N-type transistor has a control terminal coupled to a second high voltage source, a first terminal coupled to the input terminal of the level shifter, and a second terminal generating a second voltage signal. A value of the first high voltage source is larger than a value of the second high voltage source. The first P-type transistor has a control terminal receiving the first voltage signal, a first terminal coupled to the first high voltage source, and a second terminal coupled to a first node. The second N-type transistor has a control terminal coupled to the second voltage signal, a first terminal coupled to the first node, and a second terminal coupled to the low voltage source. The first node generates a third driving signal. The second P-type transistor has a control terminal receiving the third driving signal, a first terminal coupled to the first high voltage source, and a second terminal coupled to the output node. The third N-type transistor has a control terminal coupled to the second driving signal, a first terminal coupled to the output node, and a second terminal coupled to the low voltage source.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
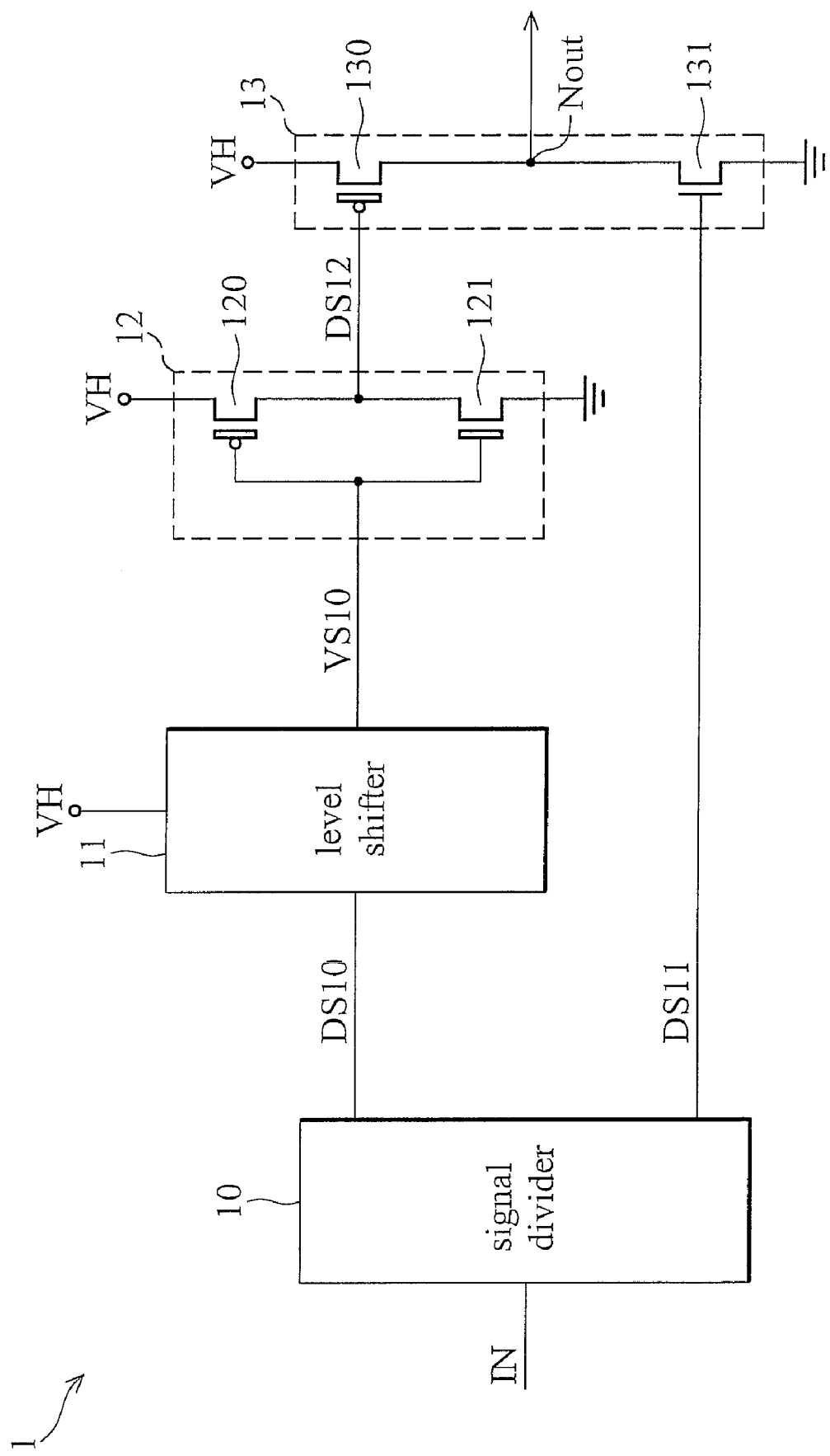
FIG. 1 shows a conventional output driving circuit.

The following description is of the best-contemplated mode of carrying out the invention. This description is made for the purpose of illustrating the general principles of the invention and should not be taken in a limiting sense. The scope of the invention is best determined by reference to the appended claims.

Output driving circuits are provided. In an exemplary embodiment of an output driving circuit in FIG. 2, an output driving circuit 2 comprises a signal divider 20, a level shifter 21, an inverter 22, an output driver 23, and a voltage controller 24. The output driving circuit 2 receives an input signal IN and provides an output signal OUT at an output node Nout. The signal divider 20 receives the input signal IN and generates driving signals DS20 and DS21 according to the input signal IN, wherein the driving signal DS20 is inverse to the driving signal DS21.

The level shifter 21 is coupled between a high voltage source VH and a low voltage source VSS and has an input terminal Tin receiving the driving signal DS20 and an output terminal Tout. The level shifter 21 comprises P-type transistors 210 and 211, N-type transistors 212 and 213, and an inverter 214. The driving signal DS20 is provided to a control terminal (gate) of the N-type transistor 212, and the inversed signal of the driving signal DS20 is provided to a control terminal (gate) of the N-type transistor 213. Through the circuit composed of the P-type transistors 210 and 211 and the N-type transistors 212 and 213, the level shifter 21 generates a voltage signal VS20 with a low level at the output terminal Tout according to the low voltage source VSS when the driving signal DS20 is at a low level, and the level shifter 21 generates the voltage signal VS20 with a high level at the output terminal Tout according to high voltage source VDD when the driving signal DS20 is at a high level. The high level of the voltage signal VS20 is higher than the high level of the driving signal DS20. According to above description, the driving signal DS20 and the voltage signal VS20 are in phase.

Figure 2:
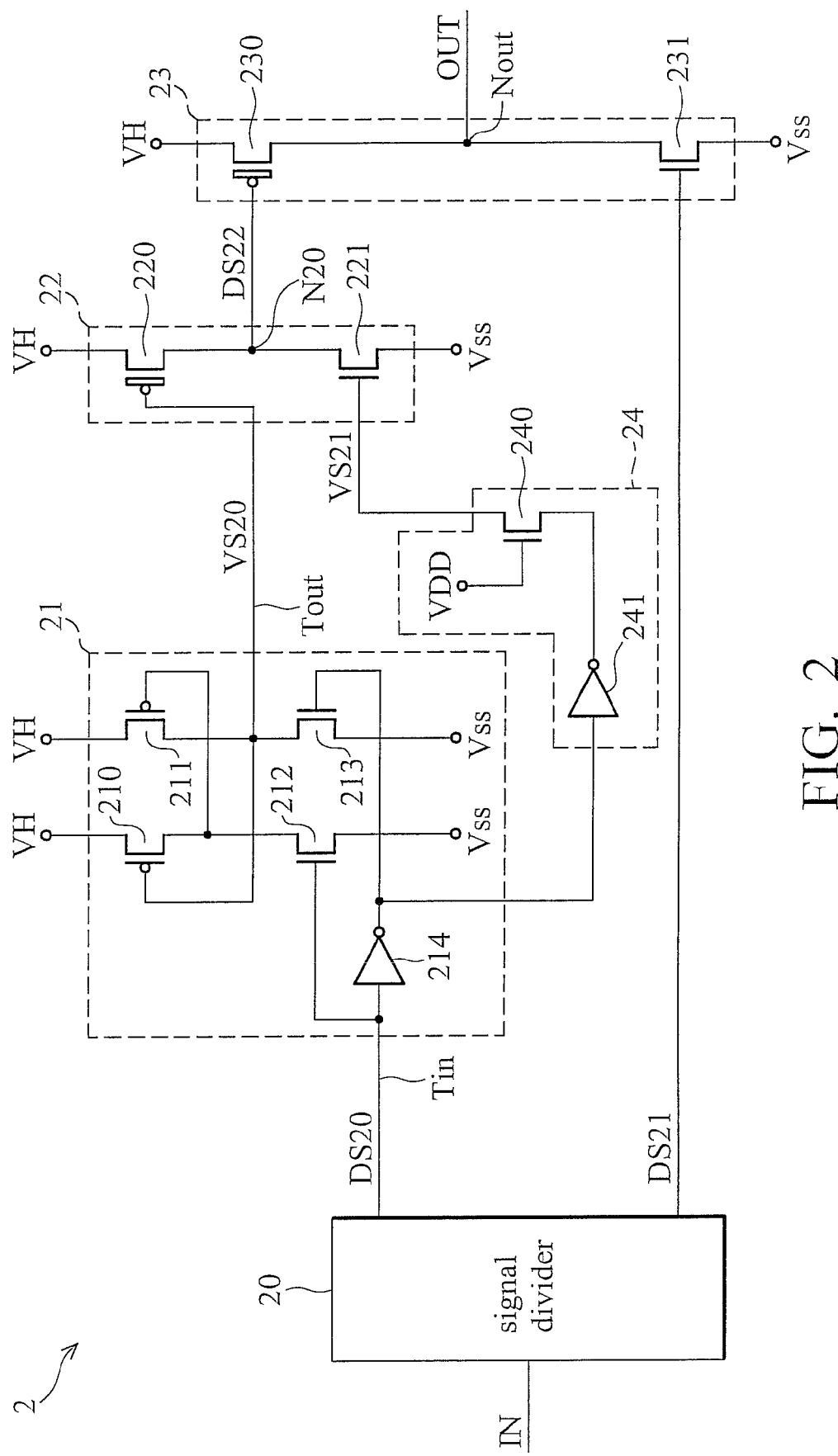
FIG. 2 is an exemplary embodiment of an output driving circuit.

The voltage controller 24 comprises an N-type transistor 240 and an inverter 241. A control terminal of the N-type transistor 240 is coupled to a high voltage source VCC, a first terminal thereof is coupled to the input terminal Tin of the level shifter 21, and a second terminal thereof generates a voltage signal VS21. Referring to FIG. 2, the first terminal of the N-type transistor 240 is coupled to the input terminal Tin of the level shifter 21 through the two inverters 214 and 241. Thus, the signal received by the first terminal of the N-type transistor 240 and the driving signal DS20 are in phase. In this embodiment, the control terminal of the N-type transistor 240 serves as a gate. According to a direction of a current, the first and second terminals of the N-type transistor 240 respectively serve as a drain and a source or a source and a drain. The voltage value of the high voltage source VH is larger than that of the high voltage source VCC. Since the high voltage source VCC provides a high voltage to the control terminal (gate) of the N-type transistor 240, the N-type transistor 240 is turned on continuously. The level of the voltage signal VS21 is changed according to the signal at the first terminal of the N-type transistor 240. Thus, the voltage signals VS20 and VS21 are in phase.

The inverter 22 comprises a P-type transistor 220 and an N-type transistor 221. A control terminal (gate) of the P-type transistor 220 receives the voltage signal VS20, a first terminal (source) thereof is coupled to the high voltage source VH, and a second terminal (drain) thereof is coupled to a node N20. A control terminal (gate) of the N-type transistor 221 receives the voltage signal VS21, a first terminal (drain) thereof is coupled to the node N20, and a second terminal (source) thereof is coupled to the low voltage source VSS. The P-type transistor 220 and the N-type transistor 221 are driven respectively by the voltage signals VS20 and VS21 to generate a driving signal DS22 at the node N20.

In this embodiment, the voltage value of the high voltage source VH is larger than that of the high voltage source VCC. It is assumed that the voltage value of the high voltage source VH is equal to 110V, while the voltage value of the high voltage source VCC is equal to 5V. For the inverter 22, the high level of the voltage signal VS20 is about 110V. The control terminal of the N-type terminal is coupled to the high voltage source VCC (5V), and is less than the high voltage source VH (110V). When the voltage signal VS21 is at a high level, the high level value (5V-0.7V) of the voltage signal VS21 is less than the high level value (about 110V) of the voltage signal VS20. Thus, the P-type transistor 220 is formed by a thick gate oxide layer, while the N-type transistor 221 is formed by a thin gate oxide layer. In other words, the thin gate oxide layer of the N-type transistor 221 is thinner than that of the P-type transistor 220.

The output driver 23 comprises a P-type transistor 230 and an N-type transistor 231. A control terminal (gate) of the P-type transistor 230 receives the driving signal DS22, a first terminal (source) thereof is coupled to the high voltage source VH, and a second terminal (drain) thereof is coupled to the output node Nout. A control terminal (gate) of the N-type transistor 221 receives the driving signal VS21, a first terminal (drain) thereof is coupled to the output node Nout, and a second terminal (source) thereof is coupled to the low voltage source VSS. As described above, the driving signal DS20 is transmitted to the level shifter 21 and then transferred by the inverter 22, so that the driving signal DS22 is inverse to the driving signal DS22. Thus, the driving signals DS21 and DS22 are in phase.

Since the high level value the voltage signal VS21 is less than the high level value of the voltage signal VS20, the gate-source voltage (Vgs) of the N-type transistor 221 is less when the N-type transistor 221 is turned on. According to the formula: $I=Kn(Vgs-Vth)^2$, the current passing through the N-type transistor 221 is less due to less gate-source voltage (Vgs), so that the time period for when the driving signal DS22 is changed from the high level to the low level is longer. In other words, the falling time of the driving signal DS22 is longer than the rising time thereof. Thus, when the P-type transistor 230 is switched from the turned-off state to the turned-on state, there is no a large current passing through the P-type transistor 230.

As described above, when the turned-on/off states of the transistors 230 and 231 are switched, the falling time of the driving signal DS22 is longer than the falling time of the driving signal DS21. Thus, the P-type transistor 230 and the N-type transistor 231 are turned on simultaneously for a short period, preventing a large current from being output to the output node Nout. Moreover, since the high level value of the voltage signal VS21 is less than the value of the high voltage source VH, the N-type transistor 221 is formed by a thin gate oxide layer, saving area of the output driving circuit 2.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An output driving circuit receiving an input signal and providing an output signal at an output node, comprising
   an inverter generating a first driving signal at a first node comprising:
      a first P-type transistor having a control terminal receiving a first voltage signal, a first terminal coupled to a first high voltage source, and a second terminal coupled to the first node; and
      a first N-type transistor having a control terminal coupled to a second voltage signal, a first terminal coupled to the first node, and a second terminal coupled to a low voltage source;
   an output driver coupled to the inverter, comprising:
      a second P-type transistor having a control terminal receiving the first driving signal, a first terminal coupled to the first high voltage source, and a second terminal coupled to the output node; and
      a second N-type transistor having a control terminal coupled to a second driving signal, a first terminal coupled to the output node, and a second terminal coupled to the low voltage source,
   wherein a falling time of the first driving signal is longer than a falling time of the second driving signal;

a signal divider receiving the input signal and generating the second driving signal and a third driving signal according to the input terminal;

a level shifter, coupled between the first high voltage source and the low voltage source, having an input terminal receiving the third driving signal and an output terminal outputting the first voltage signal; and a third N-type transistor having a control terminal coupled to a second high voltage source, a first terminal coupled to the input terminal of the level shifter, and a second terminal generating the second voltage signal, wherein a value of the first high voltage source is larger than a value of the second high voltage source.

2. The output driving circuit as claimed in claim 1, wherein the second driving signal is inverse to the third driving signal.

3. The output driving circuit as claimed in claim 1 further comprising two inverters coupled between the input terminal of the level shifter and the first terminal of the third N-type transistor.

4. The output driving circuit as claimed in claim 1 wherein the value of the first high voltage source is 110V.

5. The output driving circuit as claimed in claim 1 wherein the value of the second high voltage source is 5V.

6. The output driving circuit as claimed in claim 1, wherein the first and second driving signals are in phase.

7. The output driving circuit as claimed in claim 1, wherein the first voltage signal and the second voltage signal are in phase.

8. The output driving circuit as claimed in claim 1, wherein the value of the first high voltage source is 110V.

9. The output driving circuit as claimed in claim 1, wherein a high level value of the first voltage signal is larger than a high level value of the second voltage signal.

10. The output driving circuit as claimed in claim 1, wherein a gate oxide layer of the first N-type transistor is thinner than a gate oxide layer of the first P-type transistor.

11. An output driving circuit receiving an input signal and providing an output signal at an output node, comprising:

a signal divider receiving the input signal and generating a first driving signal and a second driving signal according to the input terminal;

a level shifter, coupled between a first high voltage source and a low voltage source, having an input terminal receiving the first driving signal and an output terminal outputting a first voltage signal;

a first N-type transistor having a control terminal coupled to a second high voltage source, a first terminal coupled to the input terminal of the level shifter, and a second terminal generating a second voltage signal, wherein a value of the first high voltage source is larger than a value of the second high voltage source;

a first P-type transistor having a control terminal receiving the first voltage signal, a first terminal coupled to the first high voltage source, and a second terminal coupled to a first node; and a second N-type transistor having a control terminal coupled to the second voltage signal, a first terminal coupled to the first node, and a second terminal coupled to the low voltage source, wherein the first node generates a third driving signal;

a second P-type transistor having a control terminal receiving the third driving signal, a first terminal coupled to the first high voltage source, and a second terminal coupled to the output node; and a third N-type transistor having a control terminal coupled to the second driving signal, a first terminal coupled to the output node, and a second terminal coupled to the low voltage source.

12. The output driving circuit as claimed in claim 11 further comprising two inverters coupled between the input terminal of the level shifter and the first terminal of the first N-type transistor.

13. The output driving circuit as claimed in claim 11, wherein the first driving signal is inverse to the second driving signal.

14. The output driving circuit as claimed in claim 11, wherein the first voltage signal and the second voltage signal are in phase.

15. The output driving circuit as claimed in claim 11, wherein the second driving signal and the third driving signal are in phase.

16. The output driving circuit as claimed in claim 11, wherein the value of the first high voltage source is 110V.

17. The output driving circuit as claimed in claim 11, wherein the value of the second high voltage source is 5V.

18. The output driving circuit as claimed in claim 11, wherein a gate oxide layer of the second N-type transistor is thinner than a gate oxide layer of the first P-type transistor.

19. The output driving circuit as claimed in claim 11, wherein a falling time of the third driving signal is longer than a falling time of the second driving signal.

20. The output driving circuit as claimed in claim 11, wherein a high level value of the fist voltage signal is larger than a high level value of the second voltage signal.

* * * * *